(12) United States Patent
Leu et al.

(10) Patent No.: US 7,348,283 B2
(45) Date of Patent: Mar. 25, 2008

(54) MECHANICALLY ROBUST DIELECTRIC FILM AND STACK

(75) Inventors: Jihperng Leu, Portland, OR (US); Jun He, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 203 days.

(21) Appl. No.: 11/023,801

(22) Filed: Dec. 27, 2004

(65) Prior Publication Data

US 2006/0138665 A1    Jun. 29, 2006

(51) Int. Cl.
*H01L 21/26* (2006.01)

(52) U.S. Cl. .................. 438/795; 438/766; 438/778; 438/780; 438/782; 257/E21.259

(58) Field of Classification Search ............... None
See application file for complete search history.

(56) References Cited

U.S. PATENT DOCUMENTS

| | | | |
|---|---|---|---|
| 6,319,850 B1 * | 11/2001 | Chang et al. | 438/763 |
| 6,919,637 B2 | 7/2005 | He et al. | |
| 6,998,216 B2 | 2/2006 | He et al. | |
| 2004/0173812 A1 * | 9/2004 | Currie et al. | 257/103 |
| 2005/0012201 A1 * | 1/2005 | Duerksen et al. | 257/702 |
| 2005/0221604 A1 | 10/2005 | He et al. | |

\* cited by examiner

*Primary Examiner*—Michael Lebentritt
*Assistant Examiner*—Kyoung Lee
(74) *Attorney, Agent, or Firm*—Rahul D. Engineer

(57) ABSTRACT

A method for forming a mechanically robust dielectric film comprises depositing a dielectric film on a substrate and then inducing a compressive strain in a top surface of the dielectric film to form a compressive strained surface. The compressive strain may be induced using an ion implantation process that bombards the dielectric film with ions that become implanted in the top surface of the dielectric film. The damage caused during ion implantation, as well as the implanted ions themselves, causes an expansion of the top surface which induces a biaxial compressive residual stress, thereby forming a compressive strained surface. The compressive strain reduces the amount of surface flaws present on the top surface, thereby improving the toughness of the dielectric film. In addition, the ion implantation process may modify the plasticity of the top surface and reduce the likelihood of fracture mechanisms based on dislocation pileup for crack initiation.

4 Claims, 6 Drawing Sheets

MECHANICALLY ROBUST DIELECTRIC FILM AND STACK

BACKGROUND

Dielectric materials are used in the formation of semiconductor devices to provide insulation between electrical components. As semiconductor device dimensions decrease, electrical components such as interconnects must be formed closer together. This unfortunately increases the capacitance between components with the resulting interference and crosstalk degrading device performance. To address this issue, dielectric materials with lower dielectric constants (i.e., low-k dielectric materials) are being used to provide better insulation between electrical components.

Low-k dielectric materials such as carbon doped oxide are prone to cracking due to their tensile stress properties. This cracking typically occurs during the integration or formation of interconnect layers, as well as during packaging processes for the semiconductor device. One conventional solution for minimizing cracking is reducing the dielectric film thickness to below the cracking threshold. This method, however, reduces the insulative properties of the dielectric film. Another solution is improving the mechanical strength and cracking resistance of the dielectric film by increasing the density of the film. Unfortunately, this is done at the expense of increasing the dielectric constant of the film, which again reduces its insulative properties. Yet another solution is the addition of a compressive etch-stop layer, but the overall capacitance tends to increase and the interface between the etch-stop layer and the dielectric film is a source of delamaination.

DETAILED DESCRIPTION

Described herein are systems and methods for a mechanically robust dielectric film and stack. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
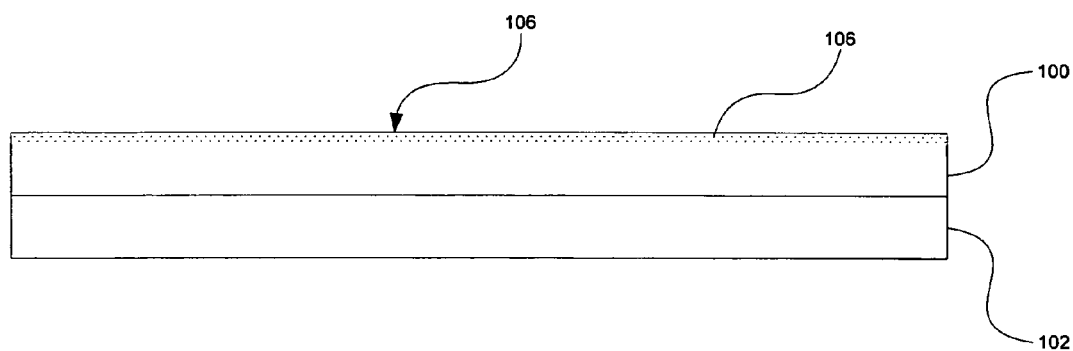
FIG. 1 illustrates a low-k dielectric film with a compressive strained surface formed in accordance with the invention.

Implementations of the invention include methods of forming mechanically robust low-k dielectric films and stacks for semiconductor device applications. The invention includes creating or inducing a compressive strain in a top surface or layer above a low-k dielectric film with tensile stresses, such as a low-k carbon doped oxide (CDO) film. FIG. 1 illustrates a low-k dielectric film 100 formed in accordance with the invention. The dielectric film 100 is deposited upon a substrate 102, such as a semiconductor wafer or an interconnect layer of a semiconductor device. The dielectric film 100 is generally used as an interlayer dielectric (ILD). Example of dielectric materials that may be used to form the dielectric film 100 include, but are not limited to, organosilicates such as silsesquioxane, siloxane, CDO, and organosilicate glass, and organics such as polytetrafluoroethylene, FLARE™ manufactured by Honeywell Corporation of Morristown, N.J., and SiLK™ manufactured by the Dow Chemical Company of Midland, Mich.

In accordance with the invention, a compressive strain is created or induced in a top surface 104 of the low-k dielectric film 100, thereby forming a compressive strained surface 106. In some implementations, the compressive strained surface 106 may be a thin, shallow layer on the dielectric film 100, as shown in FIG. 1. In other implementations, the compressive strained surface 106 may be a deep layer that encompasses a larger portion of the dielectric film 100. The thickness of the compressive strained surface 106 may be dependent on the magnitude of the compressive strain that is induced and the modulus of the compressive strained surface 106. For instance, a larger magnitude of induced compressive strain allows the compressive strained surface 106 to be thinner. In accordance with the invention, the compressive strained surface 106 may comprise up to 30% of the thickness of the dielectric film 100. In some implementations, the compressive strained surface 106 may comprise between 10% and 20% of the thickness of the dielectric film 100.

The compressive strained surface 104 of the invention tends to reduce or minimize the propagation of cracks in the low-k dielectric layer that are often caused by thermomechanical stresses during on-chip interconnect and packaging processing and integration. The reduction in cracking tends to reduce the subsequent delamination that can occur due to cracking at the interface between the dielectric film and an etch-stop layer.

Figure 2:
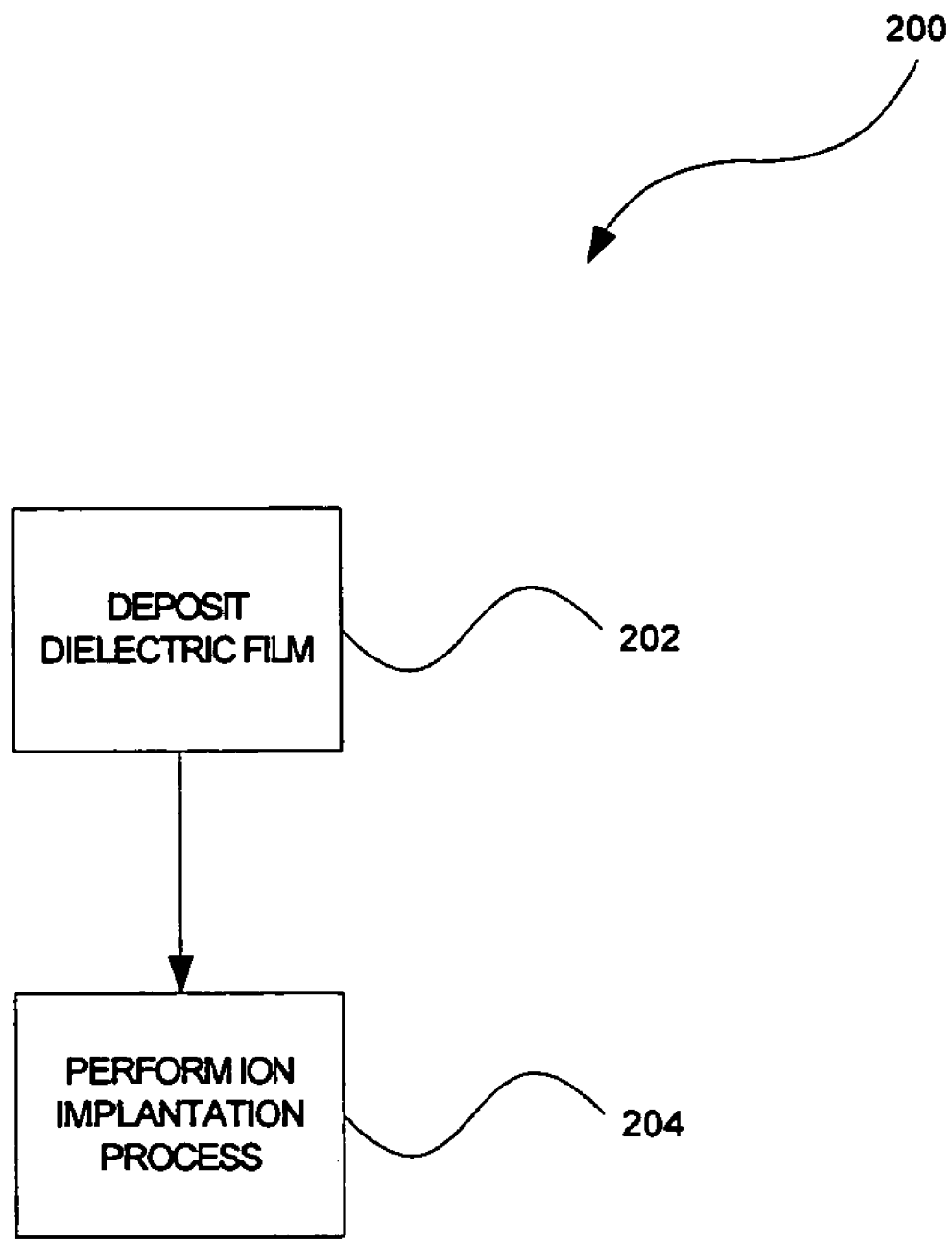
FIG. 2 describes one method for forming a compressive strained surface on a dielectric film in accordance with an implementation of the invention.

FIG. 2 describes one method 200 for forming a compressive strained surface 106 on a dielectric film 100 in accordance with an implementation of the invention. The dielectric film 100, such as CDO, is deposited or formed on a substrate 102 (process 202). A variety of deposition processes may be used to apply the deposition film 100, including but not limited to spin-on dielectric processes, chemical vapor deposition processes, sputtering processes, atomic layer deposition processes, and physical vapor deposition processes.

An ion implantation process is carried out on the deposited dielectric film 100 (process 204). The ion implantation process bombards the dielectric film 100 with ions that become implanted in the top surface 104. The ions that are implanted in the dielectric film 100 during the ion implantation process, as well as the damage caused by the ions, causes an expansion of the top surface 104. This expansion induces a large biaxial compressive residual stress in the top surface 104, thereby forming a compressive strained surface 106. The compressive strain reduces the amount of surface flaws present on the top surface 104, thereby improving the toughness of the dielectric film 100. In addition, the ion implantation process may modify the plasticity of the top surface 104 and hence reduce the likelihood of fracture mechanisms based on dislocation pileup for crack initiation.

By adjusting the operating parameters associated with the ion implantation process, the amount of ions that penetrate the dielectric film 100 and how deep the ions penetrate may be precisely controlled. This in turn provides precise control over the thickness of the compressive strained surface 106 and the amount of compressive strain that is induced within the surface 106.

The operating parameters associated with the ion implantation process include, but are not limited to, dose type, dose, and implantation energy. In some implementations, these operating parameters may be adjusted so the ions do not penetrate far into the dielectric film 100. The ion implantation process may therefore only affect a shallow portion of the top surface 104. In other implementations, the operating parameters for the ion implantation process may be adjusted to allow the ions to penetrate further into the dielectric film 100, thereby affecting a larger portion of the dielectric film 100. The dose type (i.e., the element chosen for the ion implantation process) and the dose (i.e., concentration) of that element control the degree of disruption or volume expansion in the top surface 104 of the dielectric film 100. Larger elements such as krypton or argon, or large doses of ions, tend to result in a greater degree of disruption and a higher induced compressive strain.

In implementations of the invention, the ion implantation process may use elements such as silicon, argon, or krypton with a dose that ranges from $1 \times 10^{15}$ to $1 \times 10^{17}$ atoms/cm$^2$. This concentration is approximately 1% in atomic fraction and results in a Gaussian distribution of ions as a function of depth from the surface. The average depth in the dielectric film 100 that the ions penetrate depends, at least in part, on the implantation energy. The relationship between implantation depth and implantation energy is generally linear, with approximately every 50 kiloelectron volts (keV) of applied implantation energy resulting in about 0.1 microns of ion penetration within the dielectric film 100. So for instance, 100 keV of implantation energy generally causes the ions to penetrate about 0.2 microns, 150 keV of implantation energy generally causes the ions to penetrate about 0.3 microns, and so on. In implementations of the invention, the implantation energy used may range from 20 keV to 100 keV, depending on the film density and the element chosen for the ion implantation process.

Through the use of the method 200, the top layer 104 of the dielectric film 100 is converted into a compressive strained surface 106 that may reduce or eliminate the propagation of flaws or cracks while the other attributes of the dielectric film 100 are retained. In alternate implementations of the invention, implantation processes other than an ion implantation process may be used. For instance, in some implementations a plasma immersion implantation process may be used to implant ions into the dielectric film 100. In some implementations, a bottom layer of the dielectric film 100 may be converted into a compressive strained surface 106 rather than the top layer 104. For instance, a thin layer of the dielectric film 100 may be deposited and treated with an ion implantation process to convert it into the compressive strained surface 106, and a bulk layer of the dielectric film 100 may be deposited atop the treated layer.

Figure 3:
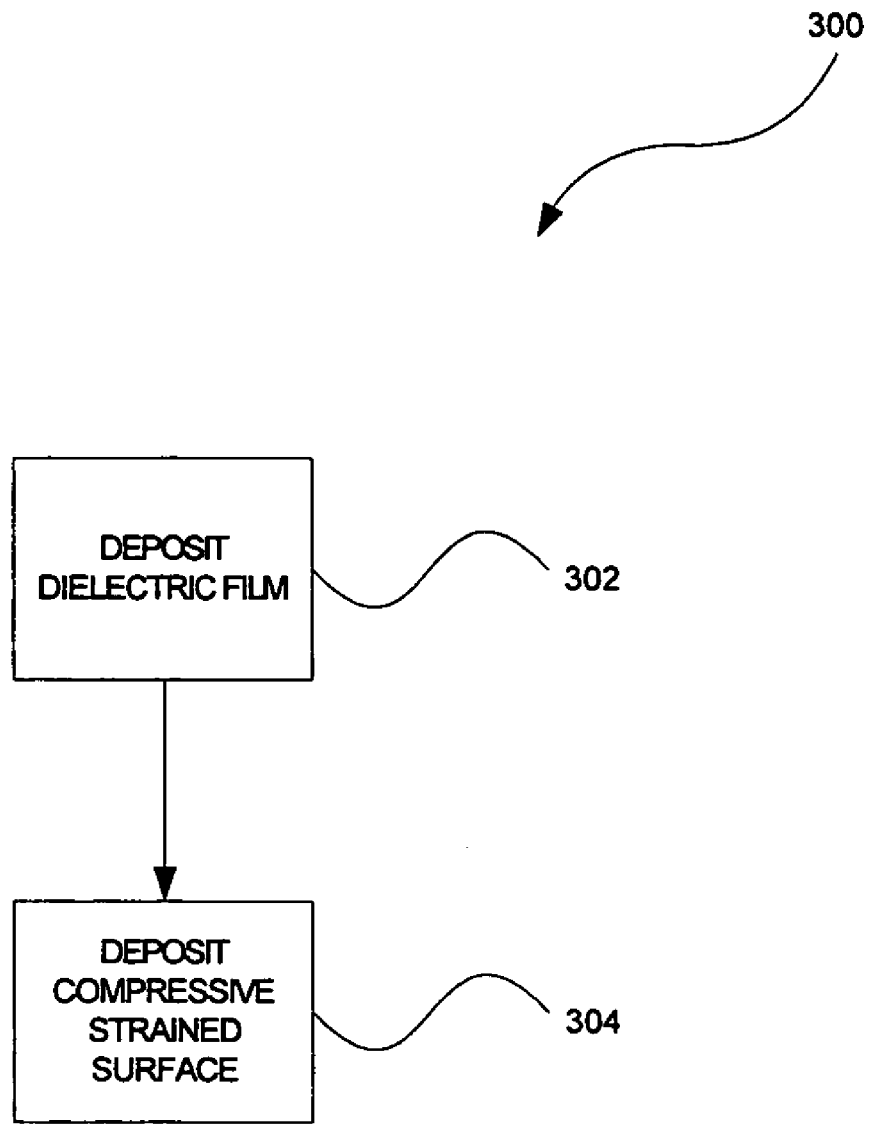
FIG. 3 describes another method for forming a compressive strained surface on a dielectric film in accordance with an implementation of the invention.

FIG. 3 describes a method 300 for forming the compressive strained surface 106 on the dielectric film 100 in accordance with another implementation of the invention. As with method 200, the method 300 begins with the dielectric film 100, such as CDO, being deposited or formed on the substrate 102 (process 302). As mentioned above, a variety of deposition processes may be used to apply the deposition film 100, including but not limited to spin-on dielectric processes, chemical vapor deposition processes, sputtering processes, atomic layer deposition processes, and physical vapor deposition processes.

A compressive strained surface 106 may then be deposited atop the dielectric film 100 (process 304). In some implementations, the compressive strained surface 106 may be deposited as part of the low-k dielectric film 100 deposition process, thereby minimizing manufacturing and monetary costs associated with the deposition of the compressive strained surface 106. In some implementations, the compressive strained surface 106 may be formed using an oxide-rich material such as silicon dioxide.

For example, in one implementation, a single chamber chemical vapor deposition process may be used to form the dielectric film 100 and the compressive strained surface 106. In one implementation, the dielectric film 100 may consist of a CDO film that is deposited using deposition gases that include Dimethyl-dimethyl-oxysilane (DMDMOS) gas. After the CDO film is deposited, the process may shut off the DMDMOS gas flow and introduce an oxygen gas flow and a silane gas flow that results in a silicon dioxide film being formed atop the CDO film. The silicon dioxide film is the compressive strained surface 106.

The method 300 therefore produces the compressive strained surface 106 without the need for an ion implantation process. The compressive strained surface 106 that is deposited in method 300 may eliminate the propagation of flaws or cracks while the other attributes of the dielectric film 100 are retained.

In some implementations, the process described above may be reversed to cause the compressive strained surface 106 to be located on the bottom of the dielectric film 100. The compressive strained layer 106 may be deposited on the substrate 102, and the dielectric film 100 may then be deposited atop the compressive strained surface 106.

Figure 4:
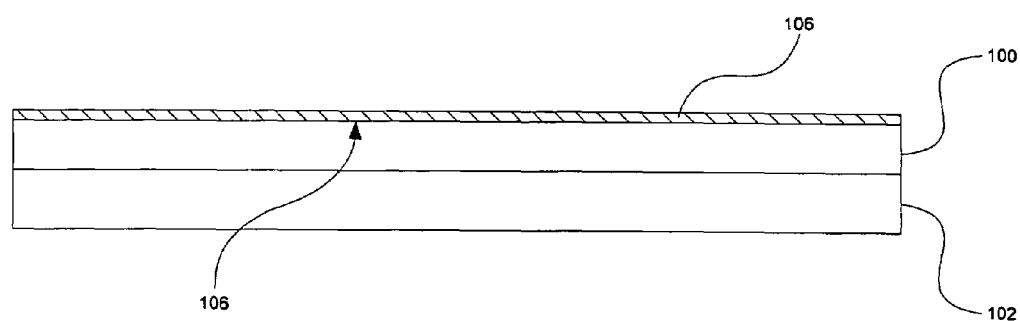
FIG. 4 illustrates a low-k dielectric film with a compressive strained surface formed in accordance with the invention.

FIG. 4 illustrates a low-k dielectric film 100 with another implementation of the compressive strained surface 106 formed in accordance with the invention. In this implementation, the compressive strained surface 106 is formed using materials that have dielectric constants ranging from 2.5 to 7, including but not limited to materials such as silicon carbide ($SiC_xH_y$), silicon nitride ($SiN_xH_y$), nitrogen-doped silicon carbide ($SiC_xN_yH_z$), and oxygen-doped silicon carbide ($SiC_xO_yH_z$). As before, the dielectric film 100 is located atop the substrate 102 and the compressive strained surface 106 is located atop the dielectric film 100. Alternately, the compressive strained surface 106 may be deposited first upon the substrate 102, and the dielectric film 100 may then be deposited upon the compressive strained surface 106. The compressive strained surface 106 may disrupt the tensile stress of the dielectric film 100 by inducing a compressive strain in the top layer 104 of the dielectric film 100.

Figure 5A:
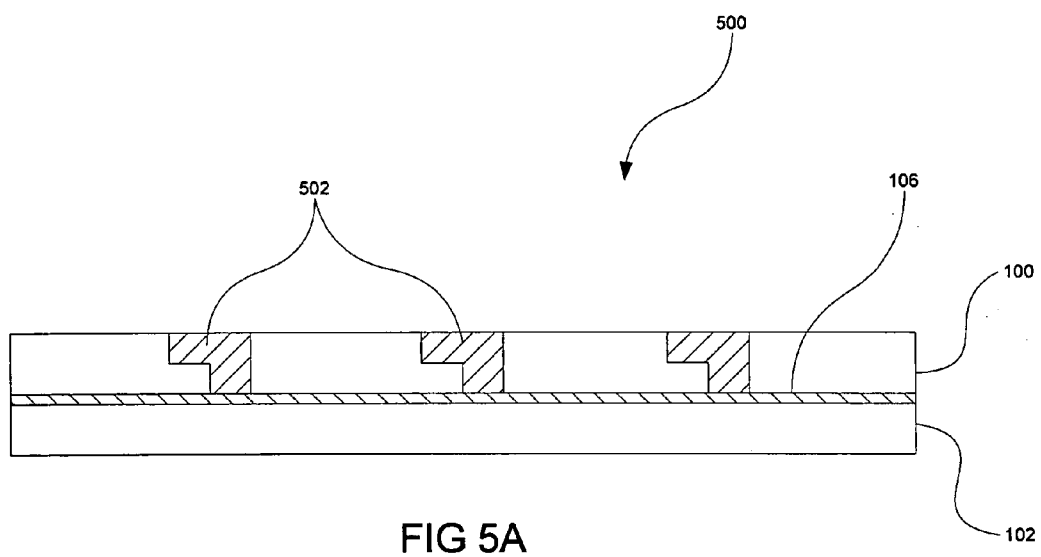
FIG. 5A describes yet another method for forming a compressive strained surface on a dielectric film in accordance with an implementation of the invention.

In implementations of the invention where the compressive strained surface 106 is located on the bottom of the dielectric film 100, the compressive strained surface 106 may function as an etch-stop layer and copper barrier, thereby minimizing the need for conventional etch-stop layers during the interconnect formation process. FIG. 5A illustrates the compressive strained surface 106 being used as an etch-stop layer/copper barrier in an interconnect/ILD stack 500, which includes one or more dual damascene copper interconnects 502. The use of the compressive strained surface 106 in the stack 500 not only induces a compressive strain in the dielectric film 100, but it also enhances the thermomechanical reliability of the stack 500 when conventional etch-stop layers are not used.

Figure 5B:
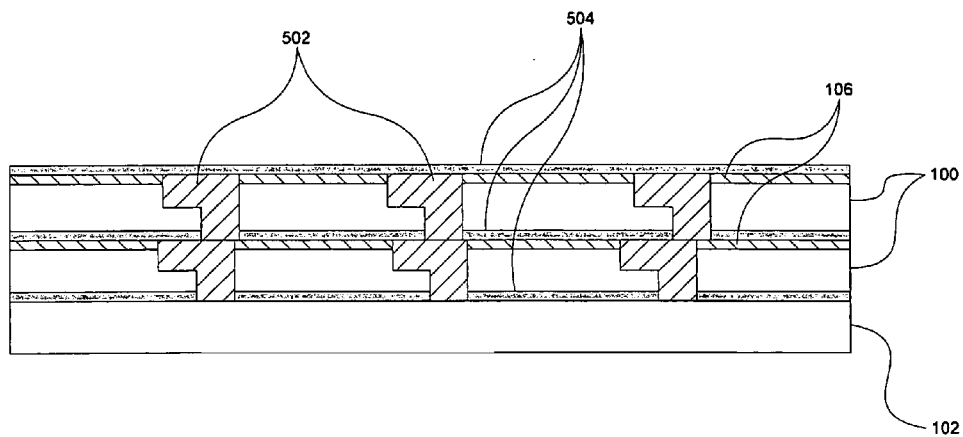
FIG. 5B illustrates a compressive strained surface used in a dual damascene process with conventional etch-stop layers in accordance with the invention.
Figure 5C:
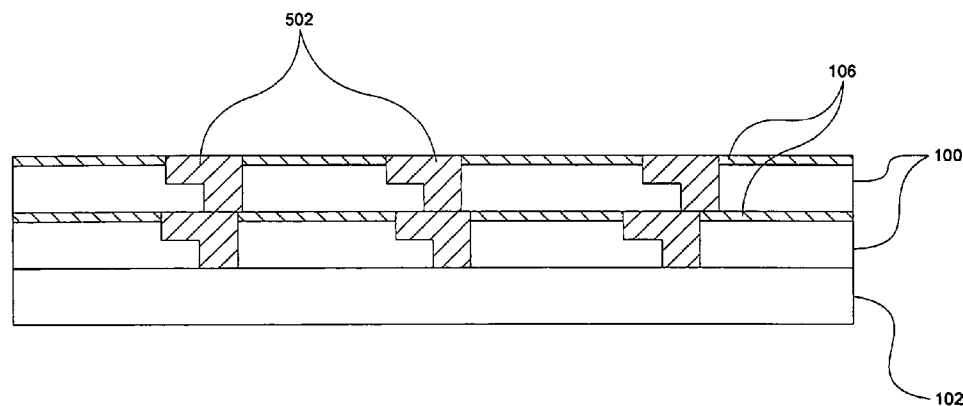
FIG. 5C illustrates a compressive strained surface used in a dual damascene process without conventional etch-stop layers in accordance with the invention.

While in some implementations the compressive strained surface 106 may be used in the stack 500 without the use of any conventional etch-stop layers, in other implementations the compressive strained surface 106 may be used in the stack 500 in addition to conventional etch-stop layers. As such, the compressive strained surface 106 may be used in a dual damascene process with conventional etch-stop layers 504 as illustrated in FIG. 5B, or in a novel dual damascene process without etch-stop layers as illustrated in FIG. 5C.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   depositing a dielectric film on a substrate, wherein the dielectric film comprises at least one of carbon doped oxide, silsesquioxane, siloxane, organosilicate glass, polytetrafluoroethylene, FLARE™, and SiLK™; and
   depositing a compressive strained surface on a top surface of the dielectric film, wherein the compressive strained surface comprises silicon carbide, silicon nitride, nitrogen-doped silicon carbide, or oxygen-doped silicon carbide.

2. The method of claim 1, wherein the depositing of the dielectric film is performed using one of a spin-on dielectric process, a chemical vapor deposition process, a sputtering process, an atomic layer deposition process, or a physical vapor deposition process.

3. The method of claim 2, wherein the depositing of the compressive strained surface is performed using one of a spin-on dielectric process, a chemical vapor deposition process, a sputtering process, an atomic layer deposition process, or a physical vapor deposition process.

4. The method of claim 3, wherein the depositing of the compressive strained surface and the depositing of the dielectric film are performed in one chamber.

* * * * *